United States Patent
Neishi (10) Patent No.: US 7,573,140 B2
(45) Date of Patent: Aug. 11, 2009

(54) SEMICONDUCTOR DEVICE AND METHOD FOR MANUFACTURING THE SAME

(75) Inventor: Yuzo Neishi, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 12/180,604

(22) Filed: Jul. 28, 2008

(65) Prior Publication Data

US 2009/0051042 A1    Feb. 26, 2009

(30) Foreign Application Priority Data

Aug. 21, 2007    (JP) .............................. 2007-214567

(51) Int. Cl.
*H01L 23/48* (2006.01)
*H01L 23/52* (2006.01)
*H01L 29/40* (2006.01)

(52) U.S. Cl. ...................... 257/780; 257/738

(58) Field of Classification Search ............... 257/780, 257/781, 738, 783, 778; 438/613, 623, 628, 438/665
See application file for complete search history.

(56) References Cited

U.S. PATENT DOCUMENTS

| | | | |
|---|---|---|---|
| 2007/0001200 A1 * | 1/2007 | Imai et al. ................... 257/288 |
| 2007/0029652 A1 * | 2/2007 | Asakawa et al. ............ 257/667 |
| 2007/0057371 A1 * | 3/2007 | Hashimoto .................. 257/738 |
| 2007/0063345 A1 * | 3/2007 | Hashimoto .................. 257/737 |
| 2007/0108607 A1 * | 5/2007 | Hashimoto .................. 257/734 |
| 2009/0032944 A1 * | 2/2009 | Tanaka et al. ............... 257/737 |
| 2009/0057924 A1 * | 3/2009 | Imai ........................... 257/784 |

FOREIGN PATENT DOCUMENTS

JP       2005-353983       12/2005

* cited by examiner

*Primary Examiner*—S. V Clark
(74) *Attorney, Agent, or Firm*—Harness, Dickey & Pierce, P.L.C.

(57) ABSTRACT

A semiconductor device includes: a semiconductor substrate that has an integrated circuit; a plurality of electrodes that is formed on the semiconductor substrate, the plurality of the electrodes being electrically coupled to the integrated circuit; a passivation film that is formed on the semiconductor substrate, the passivation film having an opening on at least a part of one of the plurality of electrodes; a resin protrusion that is disposed on the passivation film; and a plurality of wiring lines that extend to a surface of the resin protrusion, each of the plurality of wiring lines extending from one of the plurality of the electrodes, a first portion of each of the plurality of wiring lines being positioned at an uppermost edge of the resin protrusion, a second portion of each of the plurality of wiring lines being positioned between one of the plurality of electrodes and the uppermost edge of the resin protrusion, a width of the first portion of each of the plurality of wiring lines being narrower than a width of at least a part of the second portion of each of the plurality of wiring lines.

6 Claims, 6 Drawing Sheets

SEMICONDUCTOR DEVICE AND METHOD FOR MANUFACTURING THE SAME

The entire disclosure of Japanese Patent Application No. 2007-214567, filed Aug. 21, 2007 is expressly incorporated by reference herein.

BACKGROUND

1. Technical Field

The present invention relates to a semiconductor device and a method for manufacturing the same.

2. Related Art

JP-A-2005-353983 discloses that a wiring line is formed from a surface of an electrode pad to a surface of a resin protrusion to form a protruded electrode. This structure has a problem in that wiring lines formed on the resin protrusion do not have sufficient electro-migration resistance because the resin protrusion has a moisture absorption property.

SUMMARY

An advantage of some aspects of the invention is to secure an insulation property between adjacent wiring lines on a resin protrusion.

(1) According to a first aspect of the invention, a semiconductor device includes: a semiconductor substrate that has an integrated circuit; a plurality of electrodes that is formed on the semiconductor substrate, the plurality of the electrodes being electrically coupled to the integrated circuit; a passivation film that is formed on the semiconductor substrate, the passivation film having an opening on at least a part of one of the plurality of electrodes; a resin protrusion that is disposed on the passivation film; and a plurality of wiring lines that extend to a surface of the resin protrusion, each of the plurality of wiring lines extending from one of the plurality of the electrodes, a first portion of each of the plurality of wiring lines being positioned at an uppermost edge of the resin protrusion, a second portion of each of the plurality of wiring lines being positioned between one of the plurality of electrodes and the uppermost edge of the resin protrusion, a width of the first portion of each of the plurality of wiring lines being narrower than a width of at least a part of the second portion of each of the plurality of wiring lines.

In the semiconductor device, the distance between the wiring lines adjacent each other can be widened at the uppermost edge of the resin protrusion because the width of each wiring line is narrowed at the uppermost edge of the resin protrusion. As a result, the insulation property between the wiring lines adjacent each other can be secured.

(2) In the semiconductor device, each of the plurality of the wiring lines may be formed so that a width of each of the wiring lines is gradually reduced from a portion positioned at a lower end of the resin protrusion to the uppermost edge of the resin protrusion.

(3) In the semiconductor device, each of the plurality of the wiring lines may have a third portion extending from the uppermost edge of the resin protrusion to a direction opposite to the respective electrodes with a same width at the uppermost edge.

(4) According to a second aspect of the invention, a semiconductor device includes: a semiconductor substrate that has an integrated circuit; a first electrode that is disposed on the semiconductor substrate, the first electrode being electrically coupled to the integrated circuit; a second electrode that is disposed on the semiconductor substrate, the second electrode being electrically coupled to the integrated circuit; an insulation film that is disposed on the semiconductor substrate, the second electrode having a first opening and a second opening, the first opening being positioned on at least a part of the first electrode, the second opening being positioned on at least a part of the second electrode; a resin protrusion disposed on the insulation film; a first wiring line that is coupled to the first electrode, a first portion of the first wiring line being disposed on an uppermost edge of the resin protrusion; and a second wiring line that is coupled to the second electrode, the second wiring line being disposed with a distance from the first wiring line, a first portion of the second wiring line being disposed on the uppermost edge of the resin protrusion. In the device, a width of the first portion of the first wiring line is narrower than an any width of the first wiring line between the first electrode and the first portion of the first electrode, and a width of the first portion of the second wiring line is narrower than an any width of the second wiring line between the second electrode and the first portion of the second electrode.

In the semiconductor device, the distance between the first and second wiring lines can be widened because the widths of the first and second wiring lines are narrowed at the uppermost edge of the resin protrusion. As a result, the insulation property between the first and second wiring lines can be secured.

(5) According to a third aspect of the invention, a method for manufacturing a semiconductor device includes: preparing a semiconductor substrate including an integrated circuit, a plurality of electrodes electrically coupled to the integrated circuit, and a passivation film having an opening on at least a part of each of the plurality of electrodes; forming a resin protrusion on the passivation film; roughing a surface of the resin protrusion by plasma; forming a conductive film on the roughed surface of the resin protrusion; and wet-etching the conductive film with a plurality of masks on the conductive film to form a plurality of wiring lines, each of the plurality of masks having a constant width extending from atop the respective plurality of electrodes to a surface of the resin protrusion, In the step of roughing the surface of the resin protrusion, an uppermost edge of the resin protrusion may be most greatly roughed.

According to the method, the width of the wiring line can be narrowed at the upper edge of the resin protrusion by side etching. As a result, the distance between the wiring lines adjacent each other can be widened at the uppermost edge of the resin protrusion, allowing the insulation property between the wiring lines adjacent each other to be secured.

(6) In the method for manufacturing a semiconductor device, in the roughing of the surface of the resin protrusion, the plasma may be pulled from a superjacent position of a face on which the passivation film has been formed of the semiconductor substrate toward the semiconductor substrate.

BRIEF DESCRIPTION OF DRAWINGS

The invention will be described with reference to the accompanying drawings, wherein like numbers reference like elements.

DESCRIPTION OF EXEMPLARY EMBODIMENTS

Figure 1:
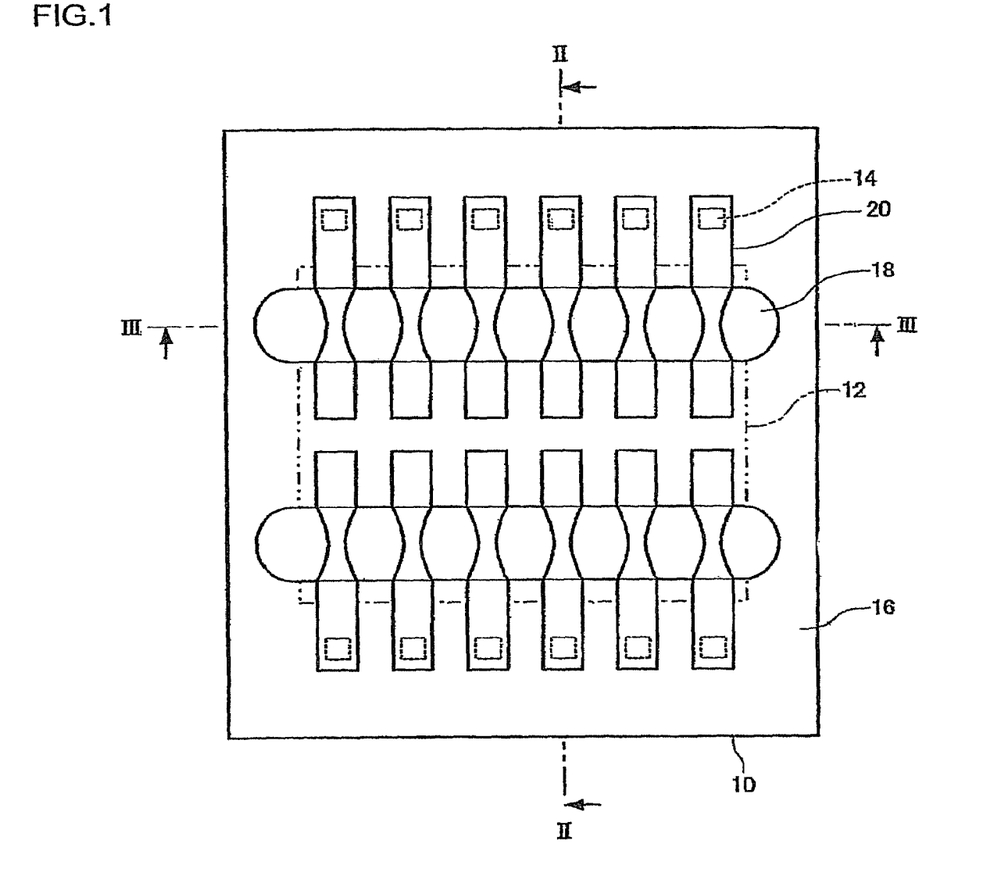
FIG. 1 is a plan view illustrating a semiconductor device according to an embodiment of the invention.
Figure 2:
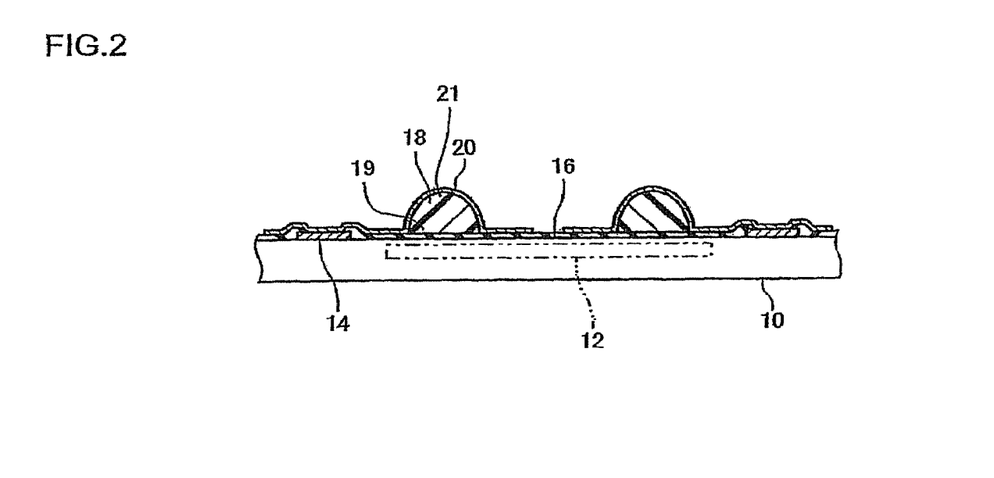
FIG. 2 is a sectional view taken along the line II-II of the semiconductor device shown in FIG. 1.
Figure 3:
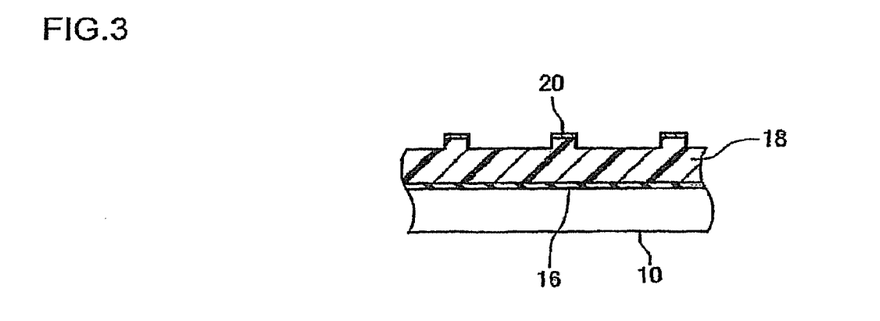
FIG. 3 is a sectional view taken along the line III-III of the semiconductor device shown in FIG. 1.

FIG. 1 is a plan view illustrating a semiconductor device according to an embodiment of the invention. FIG. 2 is a sectional view taken along the line II-II of the semiconductor device shown in FIG. 1. FIG. 3 is a sectional view taken along the line III-III of the semiconductor device shown in FIG. 1.

The semiconductor device includes a semiconductor substrate 10. The semiconductor substrate 10 has a rectangular face if it is a semiconductor chip. If it is a semiconductor wafer, each region, which becomes a semiconductor chip, in the wafer has a rectangular face. The semiconductor substrate 10 (single semiconductor chip or each region that becomes a semiconductor chip) has an integrated circuit 12 (transistors and the like). The semiconductor substrate 10 has an electrode 14 formed so as to be electrically coupled to the integrated circuit 12. The electrode 14 is arranged in a line or a plurality of lines (parallel lines). The electrode 14 is arranged along (in parallel with) a side of the rectangular face of the semiconductor substrate 10. The electrode 14 is electrically coupled to the integrated circuit 12 through an internal wiring line (not shown).

The semiconductor substrate 10 has a passivation film 16 that serves as a protective film and is formed so as to expose at least a part of the electrodes 14. The passivation film 16 may be formed with only an inorganic material such as $SiO_2$ and SiN. The passivation film 16 is formed with an insulation material. The passivation film 16 is formed above the integrated circuit 12.

The semiconductor substrate 10 has a resin protrusion 18 (on the passivation film 16). In FIG. 1, the resin protrusion 18 extends along (in parallel with) the side of the rectangular face of the semiconductor substrate 10, and is arranged in a plurality of numbers in parallel with each other. The material used for the resin protrusion 18 may include resins such as polyimide resin, silicone modified polyimide resin, epoxy resin, silicone modified epoxy resin, benzocyclobutene (BCB), polybenzoxazole (PBO), acrylic resin, silicone resin, and phenol resin.

The resin protrusion 18 has an elongated shape extending in the longitudinal direction. The surface of the resin protrusion 18 is a convex curve. The surface faces a side opposite to the semiconductor substrate 10. Specifically, the surface of the resin protrusion 18 is a surface of revolution formed by rotating a straight line positioned in parallel with and around the longitudinal axis of the resin protrusion 18 around a rotation axis, which is the longitudinal axis of the resin protrusion 18 or a straight line in parallel with the longitudinal axis. The surface of the resin protrusion 18 is shaped in a curved surface of a shape provided by cutting a cylinder with a plane in parallel with the center axis. The curved surface is a part of the outer circumference surface of the cylinder. The resin protrusion 18 is shaped wider at its lower portion than at its upper portion. In other words, a portion close to the semiconductor substrate is wider than the upper portion.

The semiconductor substrate 10 has a plurality of wiring lines 20. The plurality of wiring lines 20 is formed from atop the electrodes 14 to the surface of the resin protrusion 18. The wiring lines 20 are formed on the surface of the resin protrusion 18 with a distance between adjacent lines. The wiring lines 20 extend so as to intersect the longitudinal axis of the resin protrusion 18. Each wiring line 20 extends from atop the respective electrodes 14 to the surface of the resin protrusion 18 passing on the passivation film 16. The wiring line 20 may directly make contact with the electrode 14 or with a conductive film (not shown) interposed therebetween. The wiring line 20 extends over an end part, at a side opposite to the electrode 14, of the resin protrusion 18, and reaches on the passivation film 16. In other words, the wiring line 20 has a first portion and a second portion that are located on the passivation film 16. The resin protrusion 18 is positioned between the first and second portions.

The wiring line 20 is formed so that the width of the wiring line positioned at an uppermost edge of the resin protrusion 18 is narrower than any width of the wiring line 20 from the electrode 14 to before the uppermost edge 21. On the surface of the resin protrusion 18, the width of the wiring line 20 is gradually reduced from a lower end 19 to the uppermost edge 21 of the resin protrusion 18. According to the embodiment, since the width of the wiring line 20 is the narrowest at the uppermost edge 21 of the resin protrusion 18, the distance between the wiring lines 20 adjacent each other can be widened, thereby allowing the insulation property between the wiring lines 20 adjacent each other to be enhanced. Particularly, this structure shows an advantageous effect in a case where the semiconductor device is mounted to a wiring substrate 30 with a pressing force, which will be described later. In the mounting, a part, positioned at the uppermost edge 21, of the wiring line 20 shows the maximum extension in the width direction in the parts of the wiring line 20. However, the insulation property between the wiring lines 20 adjacent each other can be secured by narrowing the width of the wiring line 20 positioned at the uppermost edge 21 even in a case where the semiconductor device is mounted to the wiring substrate 30 with a pressing force.

As shown in FIG. 3, the upper surface of the resin protrusion 18 is formed so that a region between the wiring lines 20 adjacent each other is positioned closer to the semiconductor substrate 10 than a region directly under the wiring line 20 is. That is, the upper surface of the resin protrusion 18 is formed so that a region overlapping with the wiring line 20 is higher than a region not overlapping with the wiring line 20. As a result, the raised part, serving as an external terminal, of the wiring line 20 can readily make an electrical connection.

The semiconductor device can be manufactured by applying known methods to achieve the above-described structure. For example, the resin protrusion 18 is formed by the following steps: forming a photosensitive resin precursor layer on the passivation film 16 by spin coating; exposing the resin precursor layer with a mask; developing and patterning the layer; melting the layer by heating to form a surface having a curvature by surface tension; and re-hardening the melted one. Subsequently, a metal film is formed on the passivation film 16, the electrodes 14, and the resin protrusions 18 by sputtering. Then, the metal film is patterned by lithography with a mask having a shape to form the wiring patterns 20 each having the narrowest portion at the uppermost edge 21 of each of the resin protrusions 18. As a result, the wiring patterns 20 each having the shape described above can be formed. Alternatively, the following method may be applied.

Figure 4A:
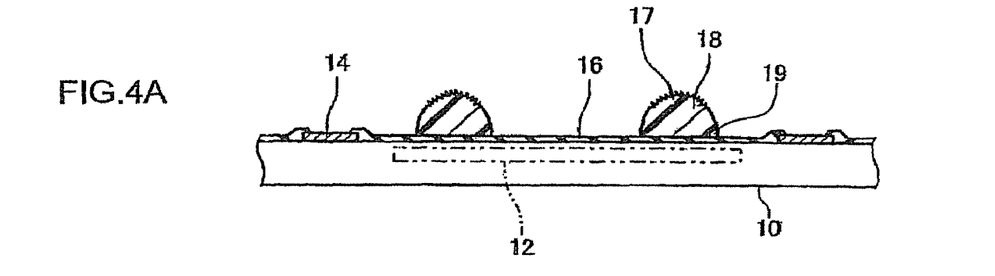
FIGS. 4A to 4C are views for explaining a method for manufacturing a semiconductor device according to another embodiment of the invention.
Figure 4B:
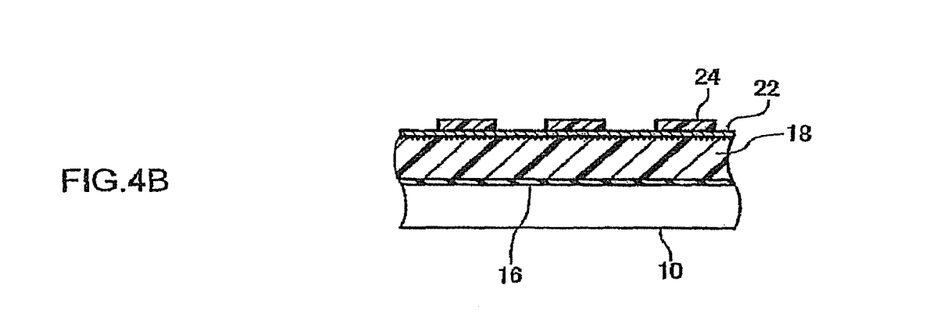
Figure 4C:
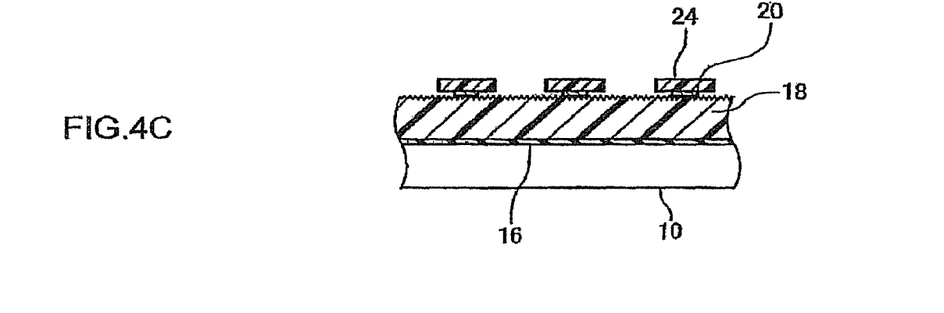

FIGS. 4A to 4C are views for explaining a method for manufacturing a semiconductor device according to another embodiment of the invention. In the embodiment, the surface of the resin protrusion 18 is roughed by plasma before forming the wiring lines 20 (refer to FIG. 4A). Specifically, ashing is carried out. In this step, the ashing is carried out by pulling plasma (e.g. $O_2$ plasma) in a direction toward the semiconductor substrate 10 so as to most greatly rough a surface, at an upper edge 17, of the resin protrusion 18 in the surfaces of the resin protrusion 18. In particular, the ashing may be carried out by pulling plasma (e.g. $O_2$ plasma) from a superjacent position of a surface, on which the resin protrusion 18 or the passivation film 16 is provided, of the semiconductor substrate 10 along a direction toward the semiconductor substrate 10 so as to most greatly rough a surface, at the upper edge 17, of the resin protrusion 18 in the surfaces of the resin protrusion 18. As described above, the ashing is carried by pulling plasma from the superjacent position of the surface, on which the resin protrusion 18 is provided, of the semiconductor substrate 10 along the direction toward the semiconductor substrate 10. This process can show an advantageous effect in that different roughness can be provided to the upper edge 17 and the lower end 19 of the resin protrusion 18 without cumbersome treatments such as performing a number of plasma treatments with a mask particularly provided to the lower end 19 of the resin protrusion 18. Here, the surface of the lower end 19 of the resin protrusion 18 may be slightly roughed than the surface of the upper edge 17, or may be not roughed.

Next, a conductive film 22 is formed on the resin protrusion 18 (including roughed surface), the passivation film 16, and the electrodes 14 exposed from the passivation film 16. Then, the conductive film 22 is wet-etched with a plurality of masks 24 each having a constant width and extending from atop the respective electrodes 14 to the surface of the resin protrusion 18 (refer to FIG. 4B). If the underlying surface (the surface of the resin protrusion 18) of the conductive film 22 is uniformly roughed, the wiring line 20 is formed to have a uniform width because the mask 24 has a constant width. In the embodiment, however, the roughness varies across the surface of the resin protrusion 18. In wet etching, an etchant flows on the underlying surface greatly roughed by a capillary phenomenon. As a result, the conductive film 22 is greatly side-etched. By utilizing the phenomenon, the upper edge, most greatly roughed, of the resin protrusion 18 is most greatly side-etched. As a result, the wiring line 20 can be formed to have the narrowest portion at the most greatly side-etched portion (refer to FIG. 4C). According to the embodiment, the width of the wiring line 20 can be narrowed at the upper edge of the resin protrusion 18 by side etching. As a result, the distance between the wiring lines 20 adjacent each other can be widened at the uppermost edge of the resin protrusion 18, allowing the insulation property between the wiring lines 20 adjacent each other to be secured. Here, photoresist or a conductive film made of a material different from that forming the conductive film 22 may be used as the mask 24. For example, Au may be used for the mask 24 while TiW or Ti may be used for the conductive film 22.

After the wiring lines 20 are formed on the resin protrusion 18, portions, between the wiring lines 20 adjacent each other, of the resin protrusion 18 are etched. As a result, the upper surface of the resin protrusion 18 is formed so that a region between the wiring lines 20 adjacent each other is positioned closer to the semiconductor substrate 10 than a region directly under the wiring line 20 is.

Figure 5A:
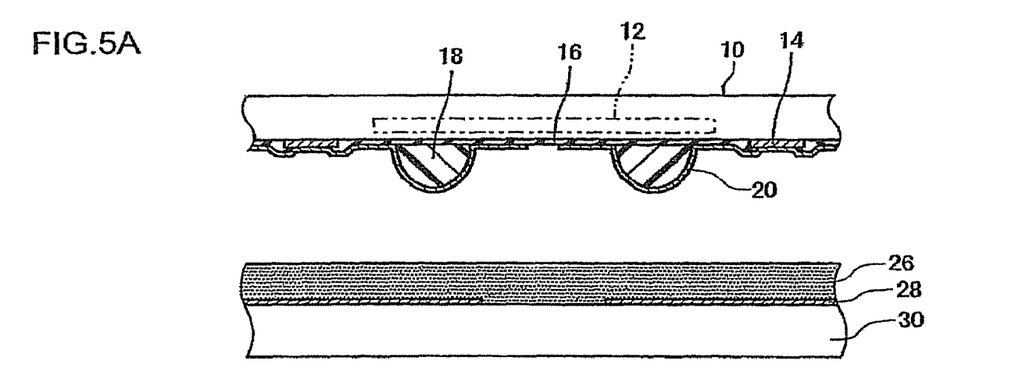
FIGS. 5A and 5B are views for explaining a method for manufacturing an electronic device using the semiconductor device according to further another embodiment of the invention.
Figure 5B:
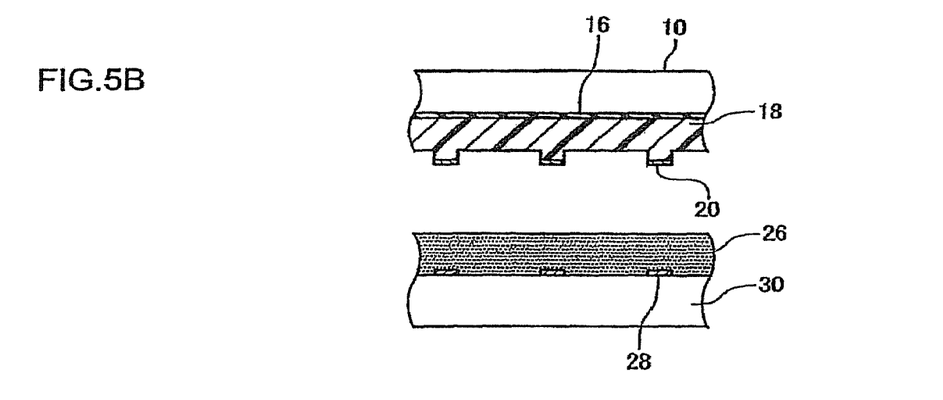

FIGS. 5A and 5B are views for explaining a method for manufacturing an electronic device using the semiconductor device according to further another embodiment of the invention. In the embodiment, the above-described semiconductor device is disposed on the wiring substrate 30 having a wiring pattern 28 with a thermosetting adhesive resin precursor 26. The semiconductor device is disposed so that the wiring line 20 on the resin protrusion 18 faces the wiring pattern 28. The wiring substrate 30 may be a part of a liquid crystal panel or an organic electrical luminescence (EL) panel. The wiring substrate 30 may be made of any material of glass, ceramics, and resins. For the adhesive resin precursor 26, an anisotropic material including conductive particles dispersed may be used. Next, the semiconductor device and the wiring substrate 30 are pressed and heated. The adhesive resin precursor 26 is hardened and contracted by heat. The adhesive resin precursor 26 is kept while being pressed until it is hardened. Upon being hardened, the adhesive resin precursor 26 is free from the pressing force. Through the steps described above, the electronic device is manufactured.

Figure 6A:
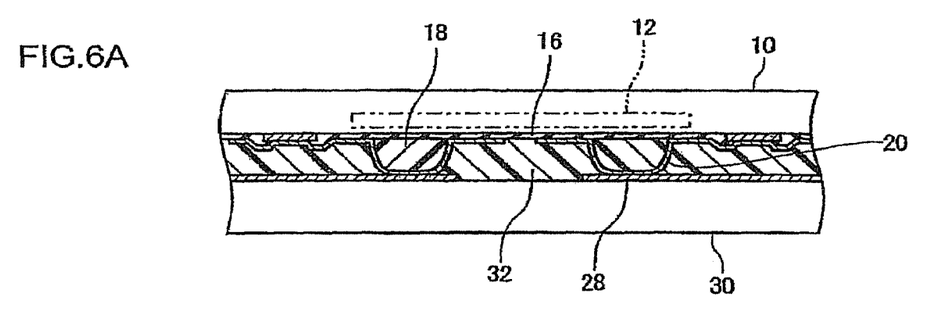
FIGS. 6A and 6B are views for explaining the electronic device according to still another embodiment of the invention.
Figure 6B:
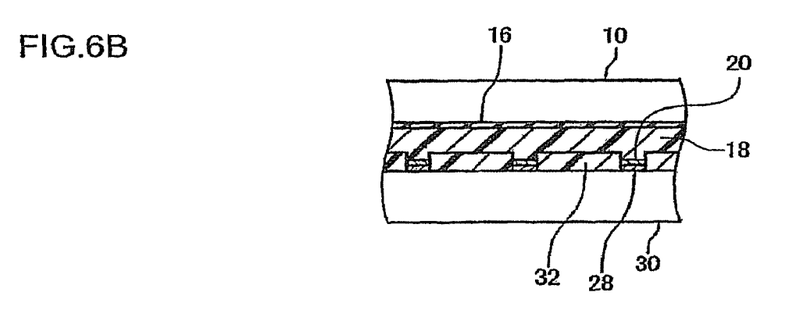

FIGS. 6A and 6B are views for explaining the electronic device according to still another embodiment of the invention. The electronic device includes the semiconductor device and the wiring substrate 30 on which the wiring pattern 28 is formed. The semiconductor device is mounted to the wiring substrate 30 so that the wiring line 20 on the resin protrusion 18 faces the wiring pattern 28. The wiring patterns 20 and the wiring pattern 28 are electrically connected.

The resin protrusion 18 is compressed in the facing direction of the semiconductor device and the wiring substrate 30. A region, between the wiring lines 20 adjacent each other, of the resin protrusion 18 does not make contact with the wiring substrate 30. Between the semiconductor substrate 10 and the wiring substrate 30, an adhesive 32 that is hardened is interposed. For the adhesive 32, an anisotropic material including conductive particles dispersed may be used. The adhesive 32 is hardened and contracted. The adhesive 32 has a remaining stress due to a contraction in hardening. A part of the adhesive 32 is disposed between the region, between the wiring lines 20 adjacent each other, on the resin protrusion 18 and the wiring substrate 30.

Figure 7:
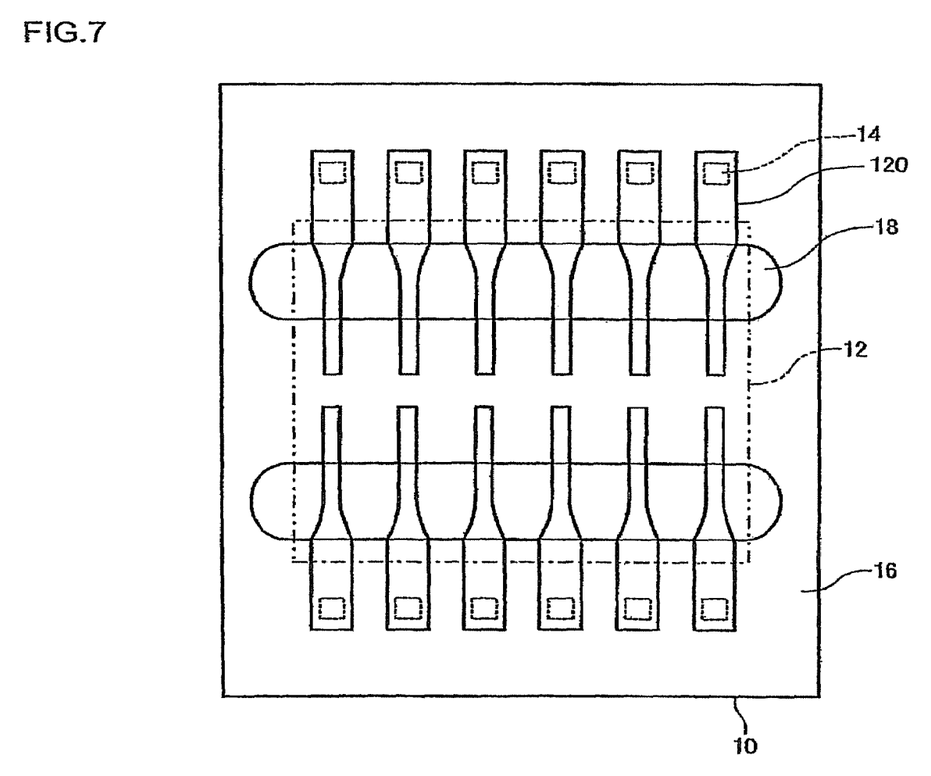
FIG. 7 is a view showing a modification of the semiconductor device according to the embodiment of the invention.

FIG. 7 is a view showing a modification of the semiconductor device according to the embodiment of the invention. This modification differs from the semiconductor device described above in that the wiring line 120 has a portion extending from the uppermost edge 21 of the resin protrusion 18 to a direction opposite to the electrode 14 with the same width at the uppermost edge 21. The structure other than the wiring line 120 is the same as that of the semiconductor device of the embodiment described above while the manufacturing method is also the same as that described above.

Figure 8:
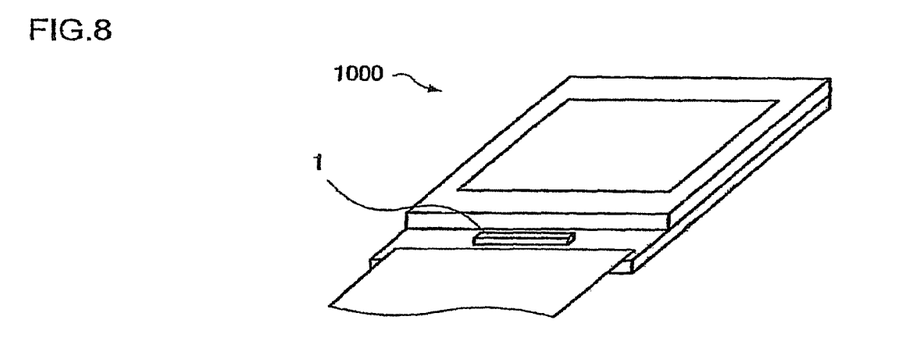
FIG. 8 is a view for explaining the electronic device using the semiconductor device according to the invention.
Figure 9:
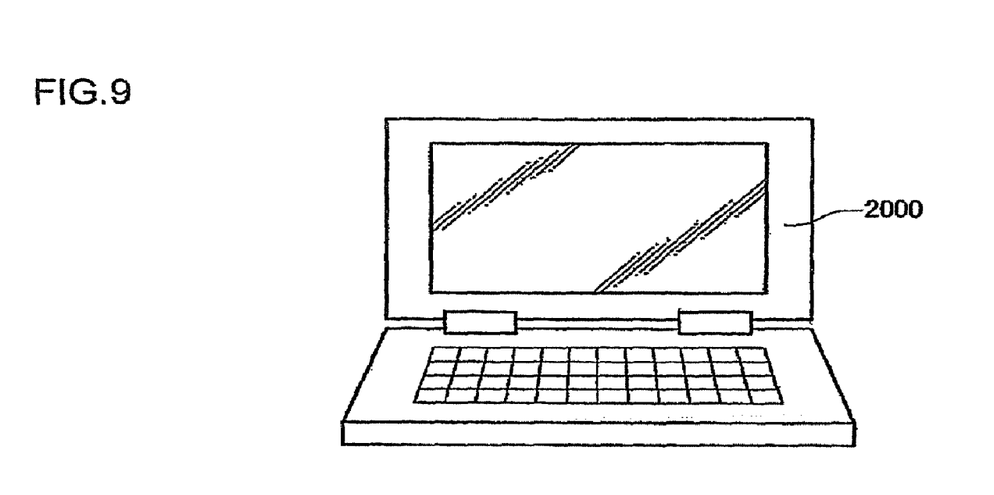
FIG. 9 is a view for explaining an electronic apparatus including the electronic device.
Figure 10:
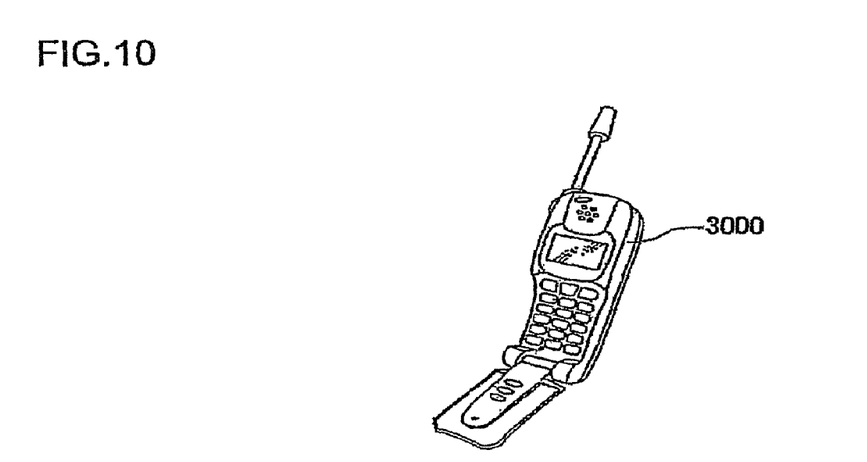
FIG. 10 is a view for explaining another electronic apparatus including the electronic device.

The electronic device may be a display device (panel module). For the display device, a liquid crystal display device and an electrical luminescence (EL) display device may be exemplified. FIG. 8 shows an electronic device 1000 structured as a display device. A semiconductor device 1 used for the electronic device 1000 is a driver IC to control the display device. In addition, as electronic apparatuses having the electronic device 1000, FIG. 9 and FIG. 10 show a notebook personal computer 2000 and a cellular phone 3000, respectively.

The present invention is not limited to the aforementioned embodiments, but various modifications thereof are possible. For example, the invention includes substantially the same structures as described in the embodiments (e.g., structures with the same functions, ways, and results or structures with the same objects and results). In addition, the invention includes structures obtained by replacing a nonessential part of the structure described in the embodiments. Further, the invention includes structures offering the same actions and results or structures achieving the same objects as of the structure described in the embodiments. Still further, the present invention includes structures obtained by adding prior art with the structures explained in the embodiments.

What is claimed is:

1. A semiconductor device, comprising:
a semiconductor substrate that has an integrated circuit;
a plurality of electrodes that is formed on the semiconductor substrate, the plurality of electrodes being electrically coupled to the integrated circuit;
a passivation film that is formed on the semiconductor substrate, the passivation film having an opening on at least a part of one of the plurality of electrodes;
a resin protrusion that is disposed on the passivation film; and
a plurality of wiring lines that extend to a surface of the resin protrusion and is disposed on the resin protrusion with a distance from each other, each of the plurality of wiring lines extending from one of the plurality of the electrodes, a first portion of each of the plurality of wiring lines being positioned at an uppermost edge of the resin protrusion, a second portion of each of the plurality of wiring lines being positioned between one of the plurality of electrodes and the uppermost edge of the resin protrusion, a width of the first portion of each of the plurality of wiring lines being narrower than a width of at least a part of the second portion of each of the plurality of wiring lines.

2. The semiconductor device according to claim 1, wherein each of the plurality of the wiring lines is formed so that a width of each of the wiring lines is gradually reduced from a portion positioned at a lower end of the resin protrusion to the uppermost edge of the resin protrusion.

3. The semiconductor device according to claim 1, wherein each of the plurality of the wiring lines has a third portion extending from the uppermost edge of the resin protrusion to a direction opposite to the respective electrodes with a same width at the uppermost edge.

4. A semiconductor device, comprising:
a semiconductor substrate that has an integrated circuit;
a first electrode that is disposed on the semiconductor substrate, the first electrode being electrically coupled to the integrated circuit;
a second electrode that is disposed on the semiconductor substrate, the second electrode being electrically coupled to the integrated circuit;
an insulation film that is disposed on the semiconductor substrate, the insulation film having a first opening and a second opening, the first opening being positioned on at least a part of the first electrode, the second opening being positioned on at least a part of the second electrode;
a resin protrusion disposed on the insulation film;
a first wiring line that is coupled to the first electrode, a first portion of the first wiring line being disposed on an uppermost edge of the resin protrusion; and
a second wiring line that is coupled to the second electrode, the second wiring being line disposed with a distance from the first wiring line, a first portion of the second wiring line being disposed on the uppermost edge of the resin protrusion, wherein a width of the first portion of the first wiring line is narrower than an any width of the first wiring line between the first electrode and the first portion of the first electrode, and a width of the first portion of the second wiring line is narrower than an any width of the second wiring line between the second electrode and the first portion of the second electrode.

5. A method for manufacturing a semiconductor device, comprising:
preparing a semiconductor substrate; the semiconductor substrate including:
an integrated circuit;
a plurality of electrodes electrically coupled to the integrated circuit; and
a passivation film having an opening on at least a part of each of the plurality of electrodes,
forming a resin protrusion on the passivation film;
roughing a surface of the resin protrusion by plasma;
forming a conductive film on the roughed surface of the resin protrusion; and
wet-etching the conductive film with a plurality of masks on the conductive film to form a plurality of wiring lines, each of the plurality of masks having a constant width extending from atop the respective plurality of electrodes to a surface of the resin protrusion, wherein an uppermost edge of the resin protrusion is most greatly roughed in the step of roughing the surface of the resin protrusion.

6. The method for manufacturing a semiconductor device according to claim 5, wherein the plasma is pulled from a superjacent position of a face on which the passivation film has been formed of the semiconductor substrate toward the semiconductor substrate in the roughing of the surface of the resin protrusion.

* * * * *